(12) United States Patent
Shiratsuru et al.

(10) Patent No.: US 12,334,407 B2
(45) Date of Patent: Jun. 17, 2025

(54) SEMICONDUCTOR DEVICE AND METHOD OF MANUFACTURING SEMICONDUCTOR DEVICE

(71) Applicant: Mitsubishi Electric Corporation, Tokyo (JP)

(72) Inventors: Takuya Shiratsuru, Tokyo (JP); Shoji Saito, Tokyo (JP); Katsuhiko Kondo, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 439 days.

(21) Appl. No.: 17/789,100

(22) PCT Filed: Feb. 7, 2020

(86) PCT No.: PCT/JP2020/004722
§ 371 (c)(1),
(2) Date: Jun. 24, 2022

(87) PCT Pub. No.: WO2021/157045
PCT Pub. Date: Aug. 12, 2021

(65) Prior Publication Data
US 2022/0359325 A1 Nov. 10, 2022

(51) Int. Cl.
*H01L 21/00* (2006.01)
*H01L 21/56* (2006.01)
(Continued)

(52) U.S. Cl.
CPC .......... *H01L 23/3107* (2013.01); *H01L 21/56* (2013.01); *H01L 23/492* (2013.01); *H01L 23/49541* (2013.01); *H01L 23/562* (2013.01)

(58) Field of Classification Search
None
See application file for complete search history.

(56) References Cited

U.S. PATENT DOCUMENTS

| | | | |
|---|---|---|---|
| 10,515,863 B2 * | 12/2019 | Nakahara | H05K 7/209 |
| 2002/0024120 A1 * | 2/2002 | Yoshimatsu | H05K 9/0022 |
| | | | 257/659 |

(Continued)

FOREIGN PATENT DOCUMENTS

| | | |
|---|---|---|
| CN | 104425471 A | 3/2015 |
| DE | 10 2006 012 429 A1 | 11/2006 |

(Continued)

OTHER PUBLICATIONS

An Office Action; "Notice of Reasons for Refusal," mailed by the Japanese Patent Office on Sep. 6, 2022, which corresponds to Japanese Patent Application No. 2021-575545 and is related to U.S. Appl. No. 17/789,100; with English language translation.

(Continued)

*Primary Examiner* — Nicholas J Tobergte
(74) *Attorney, Agent, or Firm* — Studebaker Brackett PLLC

(57) ABSTRACT

In a semiconductor device, a frame includes a first frame portion extending in a direction parallel to a connection surface to be connected to the connection surface and a second frame portion connecting a case and the first frame portion. The first frame portions are divided into a plurality of divided portions. At least one divided portion in the plurality of divided portions in the first frame portions is an elastic portion which can be elastically deformed from a first state where a tip end portion is inclined to be located on a lower side of the connection surface to a second state where the tip end portion extends in a direction parallel to the connection surface. The divided portion as the elastic portion is connected to the connection surface while being elastically deformed from the first state to the second state.

7 Claims, 3 Drawing Sheets

(51) Int. Cl.
*H01L 23/00* (2006.01)
*H01L 23/31* (2006.01)
*H01L 23/492* (2006.01)
*H01L 23/495* (2006.01)

(56) References Cited

U.S. PATENT DOCUMENTS

| | | | |
|---|---|---|---|
| 2006/0244116 A1 | 11/2006 | Tsunoda | |
| 2009/0321900 A1 | 12/2009 | Yoshida et al. | |
| 2013/0134569 A1* | 5/2013 | Ha | H01L 25/072 |
| | | | 257/676 |
| 2015/0061098 A1 | 3/2015 | Imoto et al. | |
| 2017/0372977 A1 | 12/2017 | Tamai et al. | |
| 2022/0199476 A1* | 6/2022 | Hanada | H01L 23/053 |

FOREIGN PATENT DOCUMENTS

| | | |
|---|---|---|
| JP | H04-261054 A | 9/1992 |
| JP | H11-177017 A | 7/1999 |
| JP | 2006-202885 A | 8/2006 |
| JP | 2008-226920 A | 9/2008 |
| JP | 2010-010330 A | 1/2010 |
| JP | 2015-026791 A | 2/2015 |
| JP | 2017-228630 A | 12/2017 |

OTHER PUBLICATIONS

International Search Report issued in PCT/JP2020/004722; mailed Apr. 28, 2020.

An Office Action issued by the German Patent and Trademark Office on Aug. 31, 2023, which corresponds to German Patent Application No. 112020006695.9 and is related to U.S. Appl. No. 17/789,100; with English language translation.

An Office Action; mailed by the China National Intellectual Property Administration of the People's Republic of China on Sep. 18, 2024, which corresponds to Chinese Patent Application No. 202080095409.X and is related to U.S. Appl. No. 17/789,100.

* cited by examiner

SEMICONDUCTOR DEVICE AND METHOD OF MANUFACTURING SEMICONDUCTOR DEVICE

TECHNICAL FIELD

The present disclosure relates to a semiconductor device and a method of manufacturing the semiconductor device.

BACKGROUND ART

There is a case where in a conventional semiconductor device, an interference portion is provided in an external connection terminal (corresponding to a frame) to reduce stress on a connection position where the external connection terminal and a conductive pattern are connected (refer to Patent Document 1, for example).

There is a case where a semiconductor device has a structure that a tip end portion of a metal wiring plate (corresponding to a frame) is directed to a lower side than a right angle in a natural state, and the tip end portion is pressed against a conductive pattern by elastic deformation, thereby being able to have conductive contact with the conductive pattern (refer to Patent Document 2, for example).

A dimension of a distal tip end portion of a main terminal (corresponding to a frame) is designed to be located on a lower side of an upper surface of a conductive pattern in a normal state so that a spring action is applied when the distal end portion is soldered at a time of assembly. That is to say, there is a case where a semiconductor device has a structure that an upper surface of a conductive pattern and a lower end portion of a main terminal are pressed and have contact with each other, thus the lower end portion of the main terminal is not inclined but the upper surface and the lower end portion have contact with each other at a whole surface (refer to Patent Document 3, for example).

PRIOR ART DOCUMENTS

Patent Documents

Patent Document 1: Japanese Patent Application Laid-Open No. 2017-228630
Patent Document 2: Japanese Patent Application Laid-Open No. 2008-226920
Patent Document 3: Japanese Patent Application Laid-Open No. 11-177017

SUMMARY

Problem to be Solved by the Invention

A conventional semiconductor device has a problem that a warpage occurs in a base plate due to a difference of a thermal expansion coefficient between an insulating substrate having a conductive pattern and the base plate by reason that a frame and a semiconductor element or a conductive pattern are in a high temperature state when they are connected by solder, and a clearance occurs in a connection surface where the frame and the semiconductor element or the conductive pattern are connected, thus connectivity of the frame cannot be secured.

It is considered that a length of the frame is increased in consideration of the warpage of the base plate in the high temperature state to reduce the clearance between the frame and the connection surface to secure the connectivity of the frame. However, there is a problem that even when the connectivity of the frame can be secured, a case is pulled by one end portion of the frame provided in the case by reason that rigidity of the frame is high, so that failure occurs in fitting the base plate and the case.

Accordingly, an object of the present disclosure is to provide a technique capable of suppressing failure in fitting the base plate and the case and securing the connectivity of the frame in the semiconductor device.

Means to Solve the Problem

A semiconductor device according to the present disclosure includes: a base plate, an insulating substrate fixed on the base plate and having a conductive pattern on an upper surface; a semiconductor element mounted on the conductive pattern; a case fixed to the base plate and surrounding the insulating substrate and the semiconductor element; and a frame having one end portion provided in the case and another end portion connected to a connection surface of the conductive pattern or the semiconductor element, wherein the frame includes a first frame portion extending in a direction parallel to the connection surface to be connected to the connection surface and a second frame portion connecting the case and the first frame portion, the first frame portion is divided into a plurality of divided portions, at least one divided portion in the plurality of divided portions in the first frame portion is an elastic portion which can be elastically deformed from a first state where a tip end portion is inclined to be located on a lower side of the connection surface to a second state where the tip end portion extends in a direction parallel to the connection surface, and the elastic portion is connected to the connection surface while being elastically deformed from the first state to the second state.

Effects of the Invention

According to the present disclosure, the elastic portion of the frame is connected to the connection surface while being elastically deformed from the first state to the second state, thus when a warpage occur, in the base plate in a high temperature state, the elastic portion returns from the second state to the first state by restoring force of the elastic portion, thereby following the warpage of the base plate. Accordingly, connectivity of the frame can be secured.

Furthermore, the first frame portion is divided into the plurality of divided portions, thus rigidity of the first frame portion is reduced, and pulling of the case by one end portion of the frame can be suppressed. Accordingly, failure in fitting the base plate and the case can be suppressed.

These and other objects, features, aspects and advantages of the present disclosure will become more apparent from the following detailed description when taken in conjunction with the accompanying drawings.

DESCRIPTION OF EMBODIMENT(S)

Embodiment 1

Figure 1:
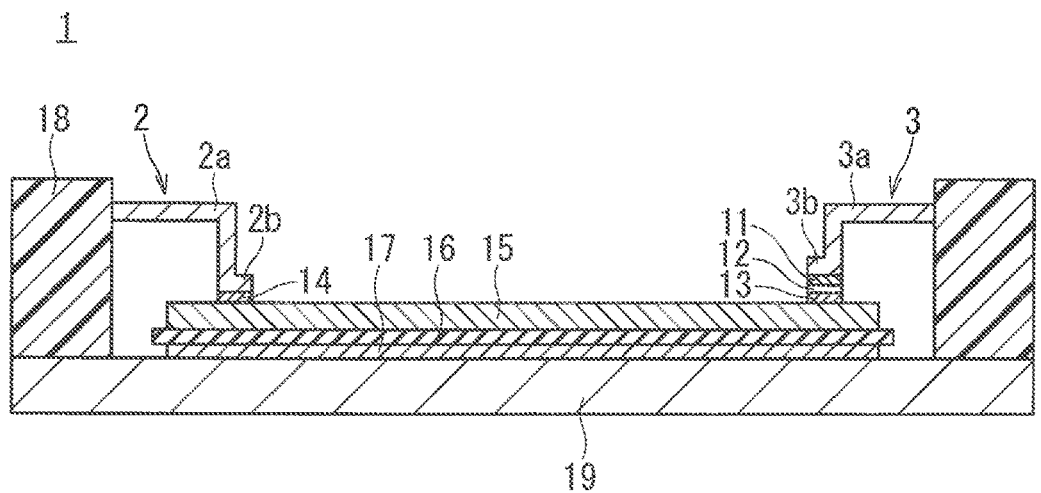
FIG. 1 A cross-sectional view illustrating an example of a semiconductor device according to an embodiment 1.
Figure 2:
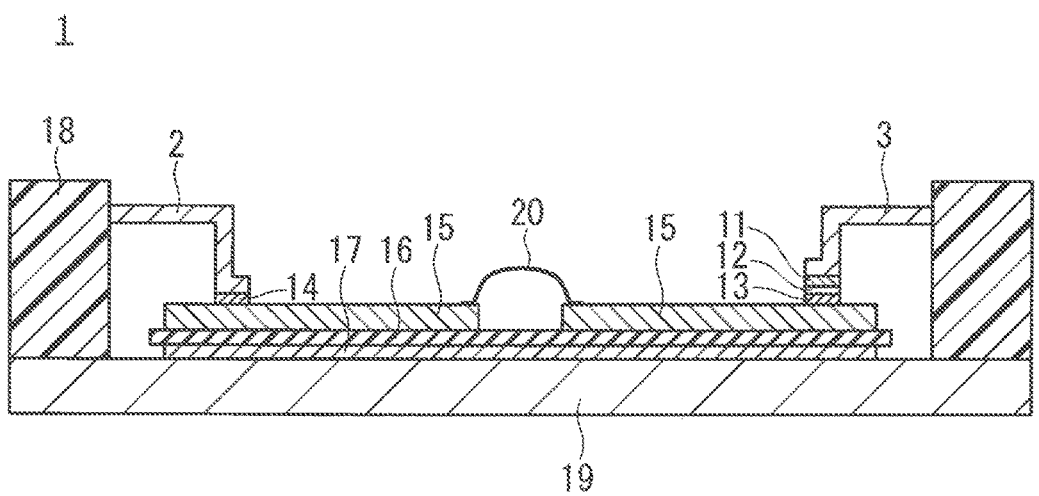
FIG. 2 A cross-sectional view illustrating another example of the semiconductor device according to the embodiment 1.
Figure 3:
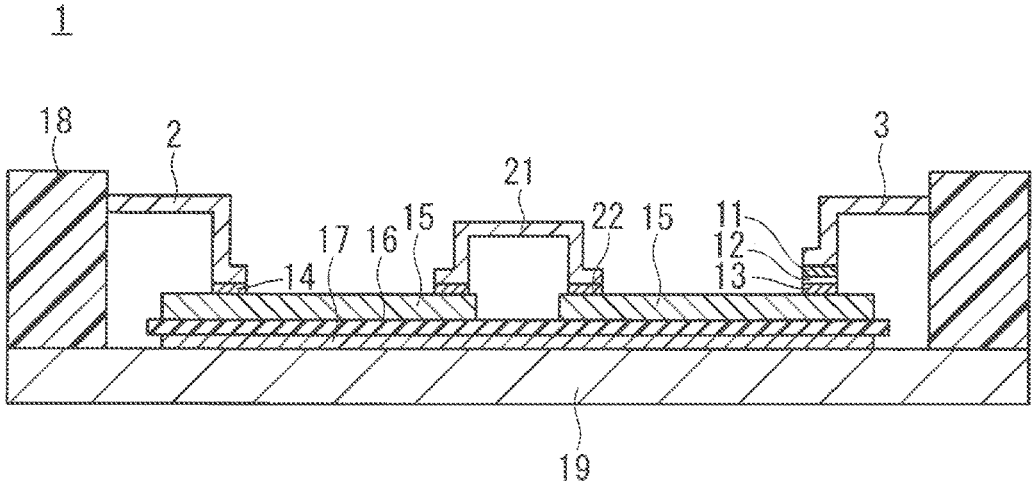
FIG. 3 A cross-sectional view illustrating still another example of the semiconductor device according to the embodiment 1.

An embodiment 1 is described hereinafter using the drawings. FIG. 1 is a cross-sectional view illustrating an example of a semiconductor device 1 according to the embodiment 1. FIG. 2 is a cross-sectional view illustrating another example of the semiconductor device 1 according to the embodiment 1. FIG. 3 is a cross-sectional view illustrating still another example of the semiconductor device 1 according to the embodiment 1.

As illustrated in FIG. 1, the semiconductor device 1 includes a base plate 19, an insulating substrate 16, a semiconductor element 12, a case 18, and frames 2 and 3.

The base plate 19 is formed of metal such as copper, for example, to have a rectangular shape in a plan view. The insulating substrate 16 is formed of epoxy resin, for example, and fixed to an upper surface of the base plate 19 via a solder 17. The insulating substrate 16 has a conductive pattern 15 formed of copper, for example, on an upper surface thereof.

The semiconductor element 12 is mounted on an upper surface of the conductive pattern 15 via a solder 13. The case 18 is formed into a rectangular frame-like shape in a plan view, and fitted in a peripheral edge portion of the upper surface of the base plate 19. The base plate 19 surrounds the insulating substrate 16 and the semiconductor element 12. An inner portion of the case 18 is filled with sealing resin (illustration thereof is omitted) made up of thermoplastic resin, for example, and the sealing resin seals the inner portion of the case 18.

The frames 2 and 3 are formed by a copper thin plate, for example. One end portion of the frame 2 is provided on an upper portion of the case 18, and the other end portion thereof is connected to the upper surface of the conductive pattern 15 as a connection surface via a solder 14. One end portion of the frame 3 is provided on the upper portion of the case 18, and the other end portion thereof is connected to an electrode of the semiconductor element 12 as a connection surface via a solder 11.

Specifically, the frame 2 includes a first frame portion 2b and a second frame portion 2a. The first frame portion 2b includes the other end portion of the frame 2. The first frame portion 2b extends in a direction parallel to the upper surface of the conductive pattern 15 as the connection surface to be connected to the connection surface. The second frame portion 2a includes one end portion of the frame 2 to connect the case 18 and the first frame portion 2b. The second frame portion 2a is formed into an L-like shape in a cross-sectional view made up of a horizontal portion extending in a right-left direction and a vertical portion extending to a lower side from the other end portion of the horizontal portion in FIG. 1.

The frame 3 includes a first frame portion 3b and a second frame portion 3a. The first frame portion 3b includes the other end portion of the frame 3. The first frame portion 3b extends in a direction parallel to the electrode of the semiconductor element 12 as the connection surface to be connected to the connection surface. The second frame portion 3a includes one end portion of the frame 3 to connect the case 18 and the first frame portion 3b. The second frame portion 3a is formed into an L-like shape in a cross-sectional view made up of a horizontal portion extending in a right-left direction and a vertical portion extending to a lower side from the other end portion of the horizontal portion in FIG. 1.

As illustrated in FIG. 2, the conductive pattern 15 may be divided into two portions, and in this case, the two conductive patterns 15 may be connected by a wire 20. As illustrated in FIG. 3, the two conductive patterns 15 may be connected by a frame 21 via a solder 22.

Figure 4:
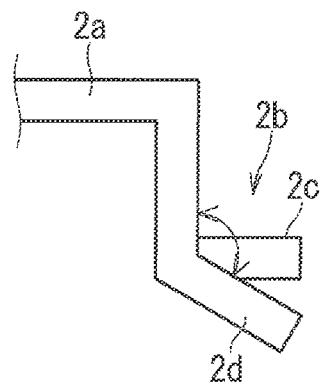
FIG. 4 A side view of a first frame portion of a frame and a peripheral portion of the first frame portion included in the semiconductor device according to the embodiment 1.
Figure 5:
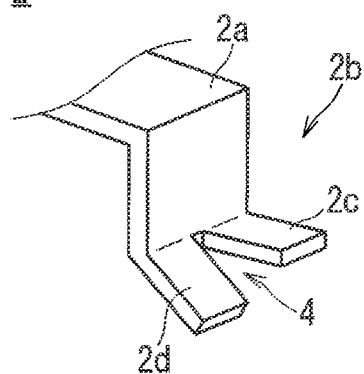
FIG. 5 A perspective view of the first frame portion of the frame and the peripheral portion of the first frame portion included in the semiconductor device according to the embodiment 1.

Next, the first frame portion 2b of the frame 2 is described in detail using FIG. 4 and FIG. 5. FIG. 4 is a side view of the first frame portion 2b of the frame 2 and a peripheral portion of the first frame portion 2b included in the semiconductor device 1 according to the embodiment 1. FIG. 5 is a perspective view of the first frame portion 2b of the frame 2 and the peripheral portion of the first frame portion 2b included in the semiconductor device 1 according to the embodiment 1. The first frame portion 3b of the frame 3 has the same configuration as the first frame portion 2b of the frame 2, thus the description of the first frame portion 3b of the frame 3 is omitted. The same applies to embodiments 2 to 4.

As illustrated in FIG. 4 and FIG. 5, the first frame portion 2b is divided into two divided portions 2c and 2d. The divided portion 2c extends in a direction parallel to the connection surface. The divided portion 2d is an elastic portion which can be elastically deformed from a first state (a state illustrated in FIG. 4 and FIG. 5) where a tip end portion is inclined to be located on a lower side of the connection surface to a second state (a state illustrated in FIG. 1) where the tip end portion extends in a direction parallel to the connection surface.

Described next is connection of the first frame portion 2b to the connection surface. Firstly, the frame 2 having the divided portion 2d in the first state is prepared. Next, the divided portion 2c is connected to the connection surface using the solder 14, and the divided portion 2d is connected to the connection surface using the solder 14 while the divided portion 2d is elastically deformed from the first state to the second state, thus the first frame portion 2b is connected to the connection surface.

When the frame 2 and the conductive pattern 15 are connected by the solder 14, a warpage occurs in the base plate 19 due to a difference of a thermal expansion coefficient between the insulating substrate 16 and the base plate 19 by reason that they are connected in a high temperature state. At this time, the divided portion 2d returns from the second state to the first state by restoring force of the divided portion 2d, thereby following the warpage of the base plate 19 in the high temperature state.

A slit 4 is formed between the divided portions 2c and 2d adjacent to each other in the first frame portion 2b. The slit 4 is formed to extend from a tip end portion to a base end portion of the first frame portion 2b. The first frame portion 2b is divided into two portions by the slit 4, thus rigidity of the first frame portion 2b decreases.

Herein, the first frame portion 2b may be divided into three or more portions. In this case, it is sufficient that at least one divided portion in the plurality of divided portions in the first frame portion 2b is an elastic portion. The rigidity of the first frame portion 2b can be further reduced by increasing the number of the divided portions.

As described above, the semiconductor device 1 according to the embodiment 1 includes: the base plate 19, the insulating substrate 16 fixed on the base plate 19 and having the conductive pattern 15 on the upper surface; the semiconductor element 12 mounted on the conductive pattern 15; the case 18 fixed to the base plate 19 and surrounding the insulating substrate 16 and the semiconductor element 12; and the frames 2 and 3 each having one end portion provided in the case 18 and the other end portion connected to the connection surface of the conductive pattern 15 or the semiconductor element 12. The frames 2 and 3 include the first frame portions 2b and 3b extending in the direction parallel to the connection surface to be connected to the connection surfaces and the second frame portions 2a and 3a connecting the case 18 and the first frame portions 2b and 3b, the first frame portions 2b and 3b are divided into the plurality of divided portions 2c and 2d, at least one divided portion 2d in the plurality of divided portions 2c and 2d in the first frame portions 2b and 3b is the elastic portion which can be elastically deformed from the first state where the tip end portion is inclined to be located on the lower side of the connection surface to the second state where the tip end portion extends in the direction parallel to the connection surface, and the divided portion 2d as the elastic portion is connected to the connection surface while being elastically deformed from the first state to the second state.

A method of manufacturing the semiconductor according to the embodiment 1 includes: a step (a) of preparing the frames 2 and 3 having the elastic portion in the first state; and a step (b) of connecting the first frame portions 2b and 3b to the connection surfaces while the elastic portion is elastically deformed from the first state to the second state.

Accordingly, the divided portion 2d as the elastic portion of the frames 2 and 3 is connected to the connection surface while being elastically deformed from the first state to the second state, thus when the warpage occurs in the base plate 19 in a high temperature state, the divided portion 2d returns from the second state to the first state by restoring force of the divided portion 2d, thereby following the warpage of the base plate 19. Accordingly, connectivity of the frames 2 and 3 can be secured.

Furthermore, the first frame portions 2b and 3b are divided into the plurality of divided portions 2c and 2d, thus rigidity of the first frame portions 2b and 3b is reduced, and pulling of the case 18 by one end portion of the frames 2 and 3 can be suppressed. Accordingly, failure in fitting the base plate 19 and the case 18 can be suppressed. According to the above configuration, yield of the semiconductor device 1 can be increased.

The solders 14 and 11 extend along side surfaces of positions where the slit 4 is formed in each of the first frame portions 2b and 3b of the frames 2 and 3, thus an external appearance of an amount of the solders 14 and 11 located between the frame 2 and the conductive pattern 15 and between the frame 3 and the semiconductor element 12 can be easily confirmed.

Embodiment 2

Figure 6:
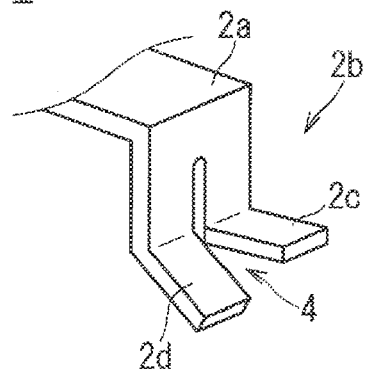
FIG. 6 A perspective view of a first frame portion of a frame and a peripheral portion of the first frame portion included in a semiconductor device according to an embodiment 2.

The semiconductor device 1 according to an embodiment 2 is described next. FIG. 6 is a perspective view of the first frame portion 2b of the frame 2 and the peripheral portion of the first frame portion 2b included in the semiconductor device according to the embodiment 2. In the description in the embodiment 2, the same reference numerals are assigned to the same constituent elements as those described in the embodiment 1, and the description thereof will be omitted.

As illustrated in FIG. 6, in the embodiment 2, the slit 4 is formed to extend from the tip end portion of the first frame portion 2b to a peripheral portion of the first frame portion 2b in the second frame portion 2a. Specifically, the slit 4 is formed to extend from the tip end portion of the first frame portion 2b to a lower portion of a vertical part of the second frame portion 2a, and a length of the slit 4 is longer than that in the case in the embodiment 1. Accordingly, the rigidity of the first frame portion 2b can be further reduced. Herein, the slit 4 formed in the frame 3 is also formed to be long in the manner similar to the slit 4 formed in the frame 2.

As described above, in the semiconductor device 1 according to the embodiment 2, the slit 4 is formed between the divided portions adjacent to each other in the first frame portions 2b and 3b, and the slit 4 is formed to extend from the tip end portions of the first frame portions 2b and 3b to the peripheral portions of the first frame portions 2b and 3b in the second frame portions 2a and 3a.

Accordingly, the rigidity of the first frame portions 2b and 3b can be further reduced, thus failure in fitting the base plate 19 and the case 18 can be further suppressed.

Embodiment 3

Figure 7:
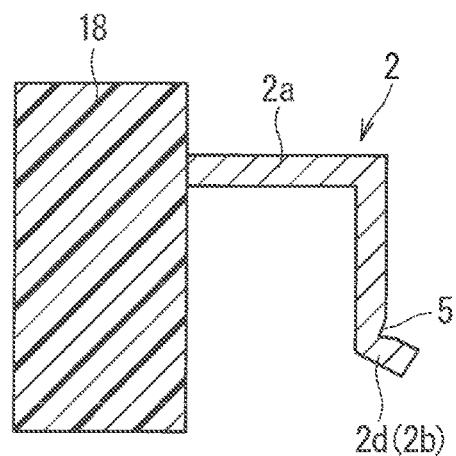
FIG. 7 A cross-sectional view of a case and a frame included in a semiconductor device according to an embodiment 3.

The semiconductor device 1 according to an embodiment 3 is described next. FIG. 7 is a cross-sectional view of the case 18 and the frame 2 included in the semiconductor device 1 according to the embodiment 3. Herein, in FIG. 7, illustration of the divided portion 2c is omitted to easily see the drawing. In the description in the embodiment 3, the same reference numerals are assigned to the same constituent elements as those described in the embodiments 1 and 2, and the description thereof will be omitted.

As illustrated in FIG. 7, in the embodiment 3, a notch 5 is formed to extend in a width direction of a surface of a base end portion of the divided portion 2d of the frame 2. The notch 5 is formed to have a thickness of ⅓ or less of a thickness of the frame 2. Accordingly, the rigidity of the frame 2 can be further reduced. Herein, the notch 5 is also formed in the first frame portion 3b of the frame 3.

As described above, in the semiconductor device 1 according to the embodiment 3, the notch 5 having the thickness of ⅓ or less of the thickness of the frames 2 and 3 is formed in the surface of the base end portion of the divided portion 2d of the frames 2 and 3. Accordingly, the rigidity of the frames 2 and 3 can be further reduced, thus failure in fitting the base plate 19 and the case 18 can be further suppressed.

Embodiment 4

Figure 8:
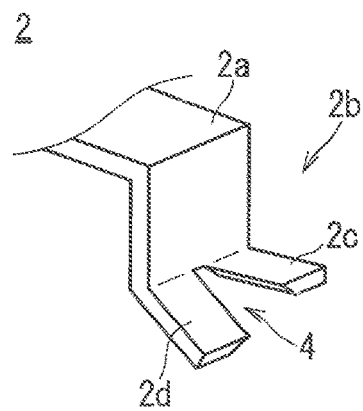
FIG. 8 A perspective view of a first frame portion of a frame and a peripheral portion of the first frame portion included in a semiconductor device according to an embodiment 4.
Figure 9:
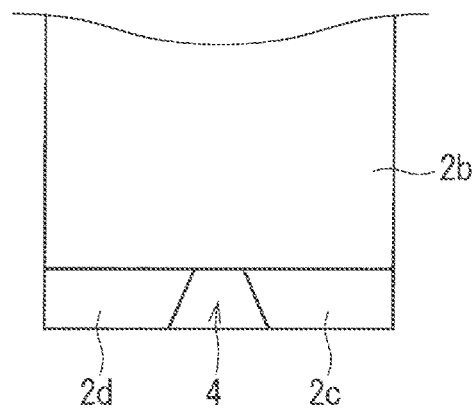
FIG. 9 A front view of a divided portion of the frame and a slit included in the semiconductor device according to the embodiment 4.

The semiconductor device 1 according to an embodiment 4 is described next. FIG. 8 is a perspective view of the first frame portion 2b of the frame 2 and the peripheral portion of the first frame portion 2b included in the semiconductor device 1 according to the embodiment 4. FIG. 9 is a front view of the divided portions 2c and 2d and the slit 4 included in the semiconductor device 1 according to the embodiment 4. In the description in the embodiment 4, the same reference numerals are assigned to the same constituent elements as those described in the embodiments 1 to 3, and the description thereof will be omitted.

As illustrated in FIG. 8, in the embodiment 4, each of the divided portions 2c and 2d in the first flame portion 2b of the frame 2 has a trapezoidal shape having an upper base longer than a lower base in a front view. Thus, as illustrated in FIG. 9, the slit 4 located between the divided portions 2c and 2d has a trapezoidal shape having an upper base shorter than a lower base in a front view in a state where the divided portion 2d is elastically deformed in the second state. Accordingly, the solder 14 easily extends along the side surface of the position where the slit 4 is formed in the frame 2 at the time of connection by the solder 14, and connectivity of the frame 2 is improved. Herein, the shape of the divided portion in the first frame portion 3b of the frame 3 is also similar to the first frame portion 2b of the frame 2.

As described above, in the semiconductor device 1 according to the embodiment 4, each of the divided portions 2c and 2d in the first frame portions 2b and 3b have a trapezoidal shape having the upper base longer than the lower base in a front view. Accordingly, the solders 14 and 11 easily extend along the side surfaces of the positions where the slit 4 is formed in the frames 2 and 3 at the time of connection by the solders 14 and 11. Accordingly, the connectivity of the frames 2 and 3 can be improved, and an external appearance of the amount of the solders 14 and 11 located between the frame 2 and the conductive pattern 15 and between the frame 3 and the semiconductor element 12 can be easily confirmed.

Although the present disclosure is described above in detail, the foregoing description is in all aspects illustrative and does not restrict the disclosure. It is therefore understood that numerous modifications can be devised without departing from the scope of the disclosure.

Each embodiment can be arbitrarily combined, or each embodiment can be appropriately varied or omitted.

EXPLANATION OF REFERENCE SIGNS 1 semiconductor device, 2 frame, 2a first frame portion, 2b second flame portion, 2c, 2d divided portion, 3 frame, 3a first frame portion, 3b second frame portion, 4 slit, 5 notch, 15 conductive pattern, 16 insulating substrate, 18 case, 19 base plate.

The invention claimed is:

1. A semiconductor device, comprising:
a base plate;
an insulating substrate fixed on the base plate and having a conductive pattern on an upper surface;
a semiconductor element mounted on the conductive pattern;
a case fixed to the base plate and surrounding the insulating substrate and the semiconductor element; and
a frame having one end portion provided in the case and another end portion connected to a connection surface of the conductive pattern or the semiconductor element, wherein
the frame includes a first frame portion extending in a direction parallel to the connection surface to be connected to the connection surface and a second frame portion connecting the case and the first frame portion,
the first frame portion is divided into a plurality of divided portions formed in a tip end portion of the first frame portion,
at least one divided portion in the plurality of divided portions in the first frame portion is an elastic portion which can be elastically deformed from a first state where the tip end portion is inclined downward toward the connection surface to a second state where the tip end portion extends in the direction parallel to the connection surface, and
the elastic portion is connected to the connection surface while being elastically deformed from the first state to the second state.

2. The semiconductor device according to claim 1, wherein
a slit is formed between the divided portions adjacent to each other in the first frame portion, and
the slit is formed to extend from the tip end portion of the first frame portion to a peripheral portion of the first frame portion in the second frame portion.

3. The semiconductor device according to claim 1, wherein
a notch having a thickness of ⅓ or less of a thickness of the frame is formed in a surface of a base end portion of the elastic portion.

4. The semiconductor device according to claim 1, wherein
each of the divided portions in the first frame portion has a trapezoidal shape having an upper base longer than a lower base in a front view.

5. A method of manufacturing a semiconductor device including: a base plate, an insulating substrate fixed on the base plate and having a conductive pattern on an upper surface; a semiconductor element mounted on the conductive pattern; a case fixed to the base plate and surrounding the insulating substrate and the semiconductor element; and a frame having one end portion provided in the case and another end portion connected to a connection surface of the conductive pattern or the semiconductor element, wherein
the frame includes a first frame portion extending in a direction parallel to the connection surface to be connected to the connection surface and a second frame portion connecting the case and the first frame portion,
the first frame portion is divided into a plurality of divided portions formed in a tip end portion of the first frame portion, and
at least one divided portion in the plurality of divided portions in the first frame portion is an elastic portion which can be elastically deformed from a first state where the tip end portion is inclined downward toward the connection surface to a second state where the tip end portion extends in the direction parallel to the connection surface, the method comprises:
(a) preparing the frame having the elastic portion in the first state; and
(b) connecting the first frame portion to the connection surface while the elastic portion is elastically deformed from the first state to the second state.

6. The semiconductor device according to claim 1, wherein
a slit is formed between the divided portions adjacent to each other in the first frame portion.

7. The method according to claim 5, wherein
a slit is formed between the divided portions adjacent to each other in the first frame portion.

\* \* \* \* \*